United States Patent [19]
Doll et al.

[11] Patent Number: 5,885,666
[45] Date of Patent: Mar. 23, 1999

[54] CONVERSION OF HEXAGONAL-LIKE BN TO CUBIC-LIKE BN BY ION IMPLANTATION

[75] Inventors: Gary Lynn Doll, Canton, Ohio; Joseph Vito Mantese, Troy, Mich.

[73] Assignee: General Motors Corporation, Detroit, Mich.

[21] Appl. No.: 851,801

[22] Filed: May 6, 1997

[51] Int. Cl.$^6$ .......................... C23C 14/06; C23C 14/12; C23C 14/14; H05H 1/00
[52] U.S. Cl. .......................... 427/530; 427/525; 427/527; 427/533
[58] Field of Search .................... 427/525, 526, 427/527, 530, 533, 576, 563; 204/192.16

[56] References Cited

U.S. PATENT DOCUMENTS

| | | | |
|---|---|---|---|
| 4,194,930 | 3/1980 | Tanaka et al. | 427/530 |
| 4,415,420 | 11/1983 | Beale | 427/530 |
| 4,656,052 | 4/1987 | Satou et al. | 427/530 |
| 4,657,774 | 4/1987 | Satou et al. | 427/530 |
| 4,683,043 | 7/1987 | Melton et al. | 204/192.16 |
| 4,683,149 | 7/1987 | Suzuki et al. | 427/533 |
| 4,762,729 | 8/1988 | Hirano et al. | 427/569 |
| 5,075,130 | 12/1991 | Reeber et al. | 427/530 |
| 5,096,740 | 3/1992 | Nakagama et al. | 427/586 |
| 5,296,119 | 3/1994 | Moustakas | 204/192.16 |
| 5,398,639 | 3/1995 | Doll et al. | 117/4 |
| 5,518,780 | 5/1996 | Tamor et al. | 427/573 |
| 5,535,905 | 7/1996 | Harris et al. | 204/192.1 |
| 5,597,625 | 1/1997 | Ong et al. | 427/575 |
| 5,723,188 | 3/1998 | Lüthje et al. | 427/577 |

OTHER PUBLICATIONS

Vel et al, "Cubic boron nitride: synthesis, physicochemical properties and applications," Mat. Sci. & Eng., B10 (1991) 149–164 No Month.

Jimenez et al, "Near–edge x–ray absorption fine structure study of bonding modifications in BN thin films by ion implantation," Appl. Phys. Lett. 68 (20), 13 May 1996.

Primary Examiner—Marianne Padgett
Attorney, Agent, or Firm—Cary W. Brooks

[57] ABSTRACT

This invention includes the discovery that poorly crystallized hexagonal-like films of boron nitride with $sp^2$ bonding can be converted by ion implantation to amorphous, cubic-like, boron nitride with $sp^3$ bonding. Preferably the $sp^2$ bonded film has a considerable amount of residual stress. The discovery that $sp^2$ bonded BN can be converted to $sp^3$ bonded BN may prove to be a significant advancement in coating technology for the electronics, machine tool, biomedical, and automotive industries. This discovery is important in that growth processes compatible with high volume production can be used to grow $sp^2$ bonded BN (e.g., sputtering, e-beam evaporation, and CVD), then implantation procedures can be used to subsequently change the film to $sp^3$ bonding. The amorphous, cubic-like, BN films can be grown on silicon wafers. This technique is also well-suited for metallic and plastic substrates because both the deposition and implantation processes occur at low temperatures. Coatings applied to metallic substrates such as carbonized steels and aluminum alloys must be processed at temperatures typically less than 150 C.

12 Claims, 2 Drawing Sheets

CONVERSION OF HEXAGONAL-LIKE BN TO CUBIC-LIKE BN BY ION IMPLANTATION

FIELD OF THE INVENTION

This invention relates to method of making boron nitride films.

BACKGROUND OF THE INVENTION

Boron nitride has many forms. There are at least four crystalline forms of boron nitride: hexagonal, rhombohedral, cubic, and wurtzite. Hexagonal and rhombohedral boron nitride (hBN & rBN) are structurally similar to hexagonal and rhombohedral graphite, respectively, with sheets of $sp^2$ bonded hexagonal arrays of boron and nitrogen atoms stacked as ABA or ABCA along the c-axis. HBN and rBN are extremely soft, electrical insulators with poor thermal conductivities. They are mainly used as high temperature solid lubricants, refractory materials, and as starting materials from which cubic or wurtzite BN are formed at high temperatures and pressures. On the other hand, cubic and wurtzite boron nitride (cBN & wBN) are structurally similar to diamond and lonsdalite, with tetrahedrally coordinated frameworks of $sp^3$ bonds. Consequently, cBN is an extremely hard (second to that of diamond), electrical insulator with an excellent thermal conductivity (also second to that of diamond). CBN is currently used as a powder for abrasive processes, and as sintered ceramics for sawing, cutting, and crushing applications. Sintered cBN is particularly useful as inserts in high speed machining of hardened steels, chilled cast iron, carbides, and nickel or cobalt-based superalloys. Unlike diamond, cBN has a low reactivity with iron and steels, and its high thermostability in oxidizing conditions makes it a better candidate than diamond for engineering materials. CBN has potential applications that include wear resistant and protective coatings, thermal head sinks for electronic devices, electrical insulators in silicon based devices, lattice matched substrates for diamond growth, and when electrically doped as high temperature and high power electronic and optoelectronic devices. However, cBN films are brittle at grain boundaries and do not adhere well to many surfaces. These cBN films tend to pop off in wear resistance applications.

Not much is known about the properties of the wurtzitic form of boron nitride.

Another very common form of BN is a quasi-amorphous phase called turbostratic boron nitride (tBN). The $sp^2$ bonded tBN actually has short-range hexagonal and/or rhombohedral order, but there is no well-established long range stacking sequence. A tBN phase is usually observed in BN films grown by physical vapor deposition (PVD) processes.

HBN is most commonly grown either in film or powder form by chemical vapor deposition (CVD). Typically, reactants such as $BCl_3$ and $NH_3$ are combined on substrates heated above 1000° C. in appropriate concentrations to form hexagonal boron nitride. The substrate temperature can be reduced considerably when the CVD process is excited by a plasma process such as hot filament, microwaves, or radio frequency waves.

CBN films and powders are more difficult to produce than hBN. For example, cBN films have only been grown successfully when a physical vapor deposition (PVD) process such as sputtering, e-beam evaporation, or laser deposition is modified with a beam of nitrogen or nitrogenic ions irradiating the target. Although the mechanism for the growth of cBN by PVD is still not well understood, it is generally accepted that only ion-assisted PVD (IA-PVD) processes will yield films with any $sp^3$ bonding. BN films grown by these IA-PVD techniques have a layer of amorphous BN at the substrate interface. About 5 nm from the interface, a tBN phase starts to emerge. The tBN phase is characterized by the hexagonal BN sheets oriented normal to the substrate. Beyond the tBN phase, a cBN phase can be present. Usually, the cBN phase is poorly crystallized and randomly oriented, although if the ions have a sufficient energy, the cBN phase with have larger crystallites and become preferentially oriented. However, these processes are not easily scaled to high volume manufacturing (as in the case of laser deposition), or do not make films with adequate adhesion (sputtering and e-beam evaporation).

Powders and crystals of cBN are produced by heating hBN and rBN to very high temperatures (2000° K) under considerable pressures (11 Gpa). The formation of cBN in this direct conversion occurs via a destructive-reconstructive diffusion-like process. The high activation barrier is lowered by the use of an hBN or rBN starting material with a poor crystallinity and small particle size. The destruction of the lattice and the diffusion of atoms is easier in a material containing a high concentration of defects. The temperature and pressure of the transformation can be reduced slightly by adding a catalyst such as an alkaline or alkaline earth metal. In this catalyzed process, compounds are added to hBN in order to reduce the high activation energy through a eutectic interaction with the BN. The driving force for the formation of cBN is the solubility difference between hBN and cBN varieties in the eutectic flux. The catalyzed process is the main method used to produce cBN at the industrial scale.

The present invention overcomes some of the disadvantages of cBN applications, and the PVD method of producing cBN films.

SUMMARY OF THE INVENTION

This invention includes the discovery that poorly crystallized hexagonal-like films of boron nitride with $sp^2$ bonding can be converted by ion implantation to amorphous, cubic-like, boron nitride with $sp^3$ bonding. Preferably the $sp^2$ bonded film has a considerable amount of residual stress. The discovery that $sp^2$ bonded BN can be converted to $sp^3$ bonded BN may prove to be a significant advancement in coating technology for the electronics, machine tool, biomedical, and automotive industries. This discovery is important in that growth processes compatible with high volume production can be used to grow $sp^2$ bonded BN (e.g., sputtering, e-beam evaporation, and CVD), then implantation procedures can be used to subsequently change the film to $sp^3$ bonding. The amorphous cubic-like BN films can be grown on silicon wafers. This technique is also well-suited for metallic and plastic substrates because both the deposition and implantation processes occur at low temperatures. Coatings applied to metallic substrates such as carbonized steels and aluminum alloys must be processed at temperatures typically less than 150 C.

The many similarities between the BN and carbon systems indicate that the cubic-like $sp^3$-bonded BN should have properties similar to the tetrahedrally-bonded, amorphous carbons (i.e., diamond-like carbons, DLCs). These properties include exceptional hardness, and extremely low coefficients of friction. Unlike DLCs, the cubic-like BN probably would also not react with ferrous materials, which would make it a valuable coating for cutting and drilling tools. The tribological properties of cubic-like BN grown on carbonized steels, aluminum alloys, and magnesium substrates should be excellent.

These and other objects, features and advantages of the present invention will be apparent from the following brief description of the drawings, detailed description and appended claims and drawings.

DETAILED DESCRIPTION

Figure 1:
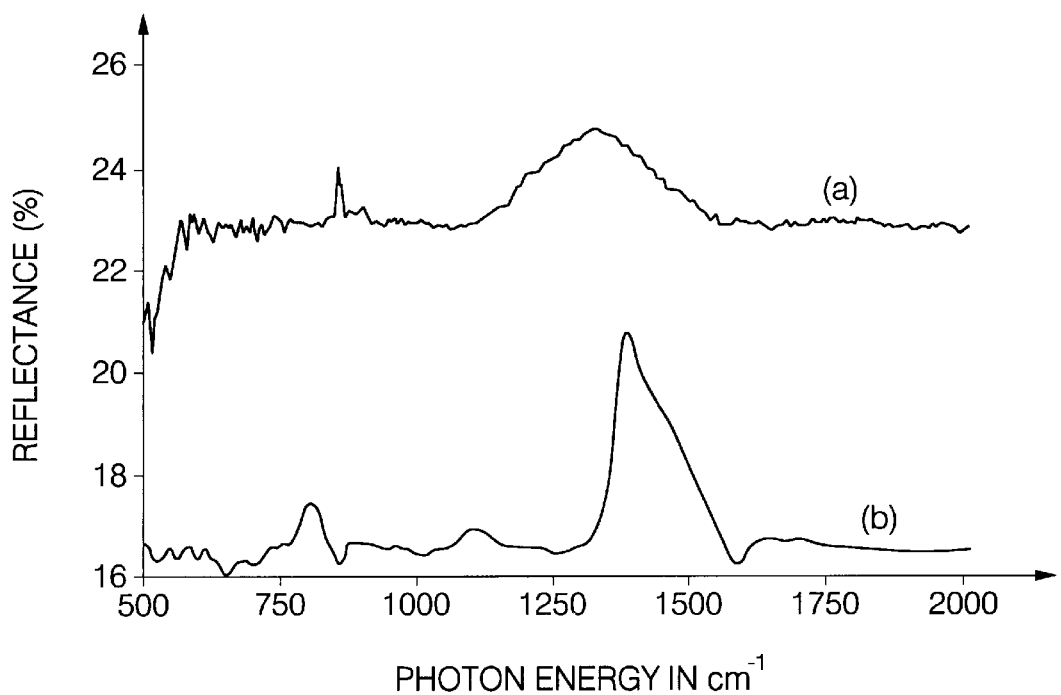
FIG. 1 is a graphical representation of the infrared reflectance spectra for an as-grown hexagonal-like BN film taken prior to (lower spectrum—curve (b)) and subsequent to (upper spectrum—curve (a)) nitrogen implantation to a fluence of $2 \times 10^{17}$ cm$^{-2}$ with a current of 100 mA.
Figure 2:
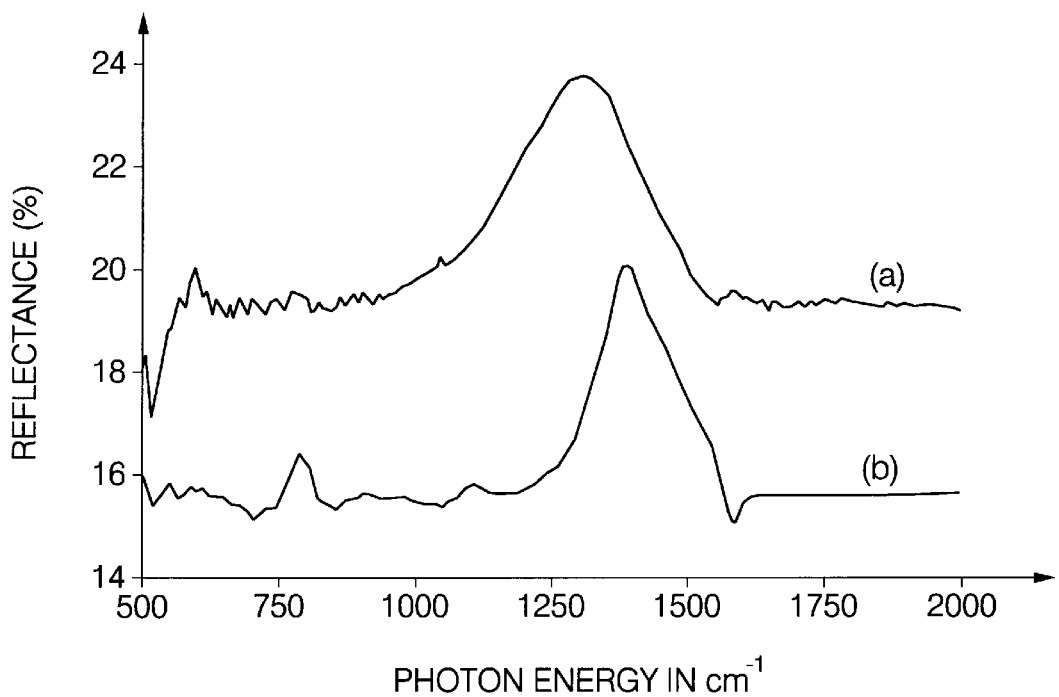
FIG. 2 is a graphical representation of the infrared reflectance spectra for an as-grown hexagonal-like BN film taken prior to (lower spectrum—curve (b)) and subsequent to (upper spectrum—curve (a)) nitrogen implantation to a fluence of $2 \times 10^{17}$ cm$^{-2}$ with a current of 50 mA.

According to the present invention, BN films were grown on a silicon substrate using the ion-assisted PVD technique of pulsed laser deposition. These films were grown by focusing a beam from a pulsed KrF excimer laser ($\lambda$=248 nm, repetition rate=10 Hz, beam intensity=300 mJ cm$^{-2}$) onto an hBN target in a 100 mTorr atmosphere of nitrogen. Material jettisoned from the target condensed on a silicon (001) substrate held to temperatures less than 150 C. As grown, these films have very little crystallinity and are entirely sp$^2$ bonded. We refer to these BN films as being hexagonal-like. The poor crystallinity and small grain sizes are believed to lower the activation barrier energy between hBN and cBN and assist in the diffusion of atoms, elements desirable in the conversion of hBN to cBN. The BN films were approximately 100 nm thick and appeared dark blue in color. The color arises from an optical interference effect typical of smooth transparent films on reflective substrates. Thin BN films are most easily characterized by infrared spectroscopy since they do not scatter x-rays well and electron microscopy specimens are difficult and tedious to prepare. The infrared reflectance for an as-grown film (curve (b) is shown in FIGS. 1–2. HBN has two high frequency infrared active phonons. These are the 1380 cm$^{-1}$ stretching and 780 cm$^{-1}$ B-N-B bending modes. These features are the dominant features of the infrared spectrum.

Some of these films were implanted with nitrogen ions at 180 keV to a fluence of $2 \times 10^{17}$ cm$^{-2}$, at currents of 50 and 100 micro amps. The current was kept low to avoid heating the film. The infrared spectra of the implanted films (curve (a)) are shown in FIGS. 1–2. The spectra have been altered considerably from the sp$^2$ BN spectrum (curve (b)) shown in FIGS. 1–2. A 1080 cm$^{-1}$ peak is characteristic of cBN films under compressive stress, while bulk cBN has a single phonon at 1060 cm$^{-1}$. Qualitatively, this indicates that ion-implantation altered the bonding in the film.

The results obtain are independent of the ion used. A variety of ions such as argon, xenon and the like can also be used The hBN film can be deposited in a variety of methods and preferably have more the 1 Gpa of compressive stress. The voltage, fluence and current are selected to have sufficient energy to transform the hBN film to the sp$^3$ bonded stated. Preferably the voltage, fluence and current are selected to implant the maximum number of ions half way through the film. This produces an amorphous, tetrahedral bonded BN film with good adhesion characteristics and is not brittle and therefore has excellent wear resistance properties In order to obtain a more quantitative analysis of the bonding, implanted and as-grown films were sent to Lawrence Livermore National Laboratories, where researchers performed high intensity x-ray absorption experiments on them at the Advanced Light Source in Berkeley. Near edge x-ray absorption fine structure spectroscopy (NEXAFS) is more sensitive to the bonding in BN films than most techniques, in that it is sensitive to the bonding configuration of each type of atom in the entire film and is not influenced by the grain size. In fact, NEXAFS has been shown to be useful in determining the type of bonding in a small domain-size, thin film of diamond where Raman spectroscopy has given ambiguous and indeterminate results. The advantages of NEXAFS with regards to electron spectroscopies are a better energy resolution, greater probe depth, and the avoidance of damage in the substrate induced by electron irradiation. NEXAFS already has been used successfully to assess the bonding in the different BN phases.

Figure 3:
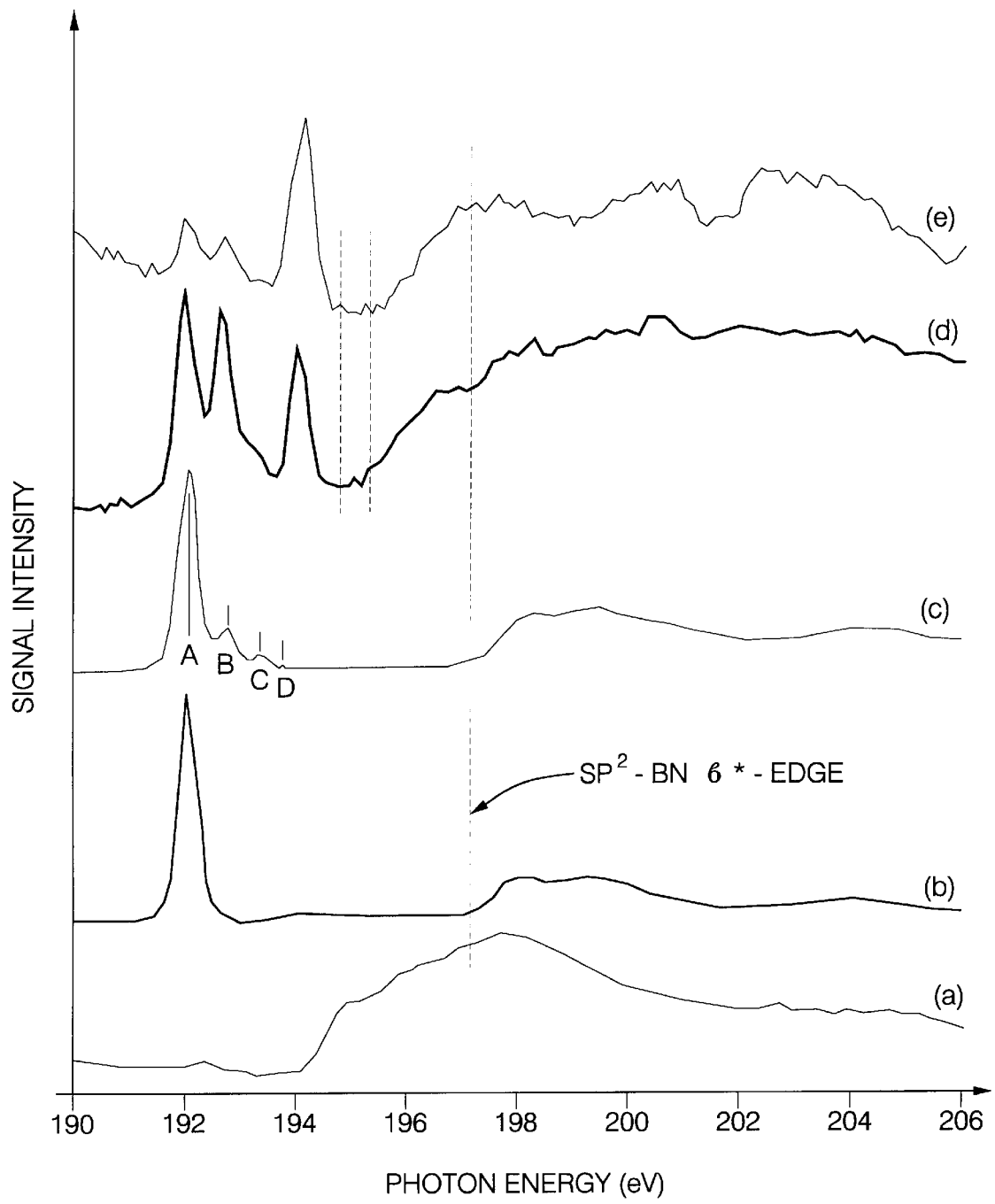
FIG. 3 is a graph of B(1s) NEXAFS spectra for films according to the present invention.

FIG. 3 shows a series of B(1s) absorption spectra corresponding to the $N_2^+$ implantation of BN/Si(100) thin films. Curves (a) and (b) are reference spectra corresponding to c-BN and h-BN respectively. The absorption edge in the c-BN spectrum appears at about 194.2 eV and corresponds to transitions from the 1s core level to the $\sigma^*$ states in the conduction band. Since the hybridization is sp$^3$, $\pi^*$ features that are characteristic of sp$^2$ bonding are not present in the spectrum. Curve (c) corresponds to the as-grown BN/Si (100) thin film, evidencing the hexagonal-like type of bonding. The four components A–D already discussed are present in the $\pi^*$ region in spite of the single peak in the reference h-BN. The side features on the $\pi^*$ absorption in BN thin films were observed previously, but have only recently been attributed to N-void defects. Curve (d) corresponds to a BN/Si(100) thin film after implantation with $N_2^+$ at 180 keV at an ion current of 50 $\mu$A, and curve (e) at an ion current of 100 $\mu$A. The features in the $\pi^*$ region reveal the damage induced in the hexagonal planes and the presence of elemental boron, which increases for larger ion current.

In the $\sigma^*$ region of the NEXAFS data, curves (d–e) show that $N_2^+$ ion bombardment produces a shift in the absorption edge from the sp$^2$ position at 197.2 eV to 195 eV. According to the previous discussion, the states extending under 197 eV can originate from sp$^3$ phases or from elemental boron. Taking into account that the $\pi^*/\sigma^*$ ratio for elemental boron is about 3:1, one concludes that a significant part of the $\sigma^*$ intensity in curves (d–e) is not related to elemental boron as evidenced by the presence of peak D, and must hence correspond to sp$^3$ BN.

We claim:

1. A method comprising the steps of implanting ions into a film having a portion with sp$^2$ bonded boron and nitrogen atoms to convert a substantial portion of sp$^2$ bonded atoms to sp$^3$ bonded atoms, wherein the film has a thickness of 100 nm or less, and wherein the ions are implanted to about one half of the thickness of the film.

2. A method as set forth in claim 1 wherein the film has compressive stress of at least 1 Gpa prior to implanting the ions.

3. A method as set forth in claim 1 wherein the ions comprises nitrogen ions.

4. A method as set forth in claim 1 wherein the step of implanting ions is accomplished using nitrogen ions at 180 keV to a fluence of $2\times10^{17}$ cm$^{-2}$, at a current of about 50 to about 100 microamps.

5. A method as set forth in claim 1 wherein the ions are selected from the group consisting of nitrogen, argon, and xenon, and mixture thereof.

6. A method as set forth in claim 1 wherein the film is held at a temperature of 150 degrees C or less.

7. A method as set forth in claim 6 wherein the film is deposited on a silicon surface prior to implanting.

8. A method as set forth in claim 1 wherein the film is deposited on a metal substrate prior to implanting and wherein the sp$^2$ bonded atoms remaining after implanting ion provide sufficient adhesion to the metal substrate for wear resistant applications of the film.

9. A method ass set forth in claim 1 wherein the film is deposited on a polymer based substrate prior to implanting.

10. A method comprising the steps of implanting ions into a film having a portion with sp$^2$ bonded boron and nitrogen atoms to convert a substantial portion of sp$^2$ bonded atoms to sp$^3$ bonded atoms, wherein the step of implanting ions is accomplished using nitrogen ions at 180 keV to fluence of $2\times10^{17}$ cm$^{-2}$, at a current of about 50 to about 100 microamps.

11. A method as set forth in claim 10 wherein the film has a thickness of 100 nm or less.

12. A method as set forth in claim 10 wherein the ions are implanted to about one half of the thickness of the film.

* * * * *